May 2, 1967 J. N. LIBBY ETAL 3,317,751
REVERSIBLE RING COUNTER EMPLOYING CASCADED SINGLE SCR STAGES
Filed May 4, 1964
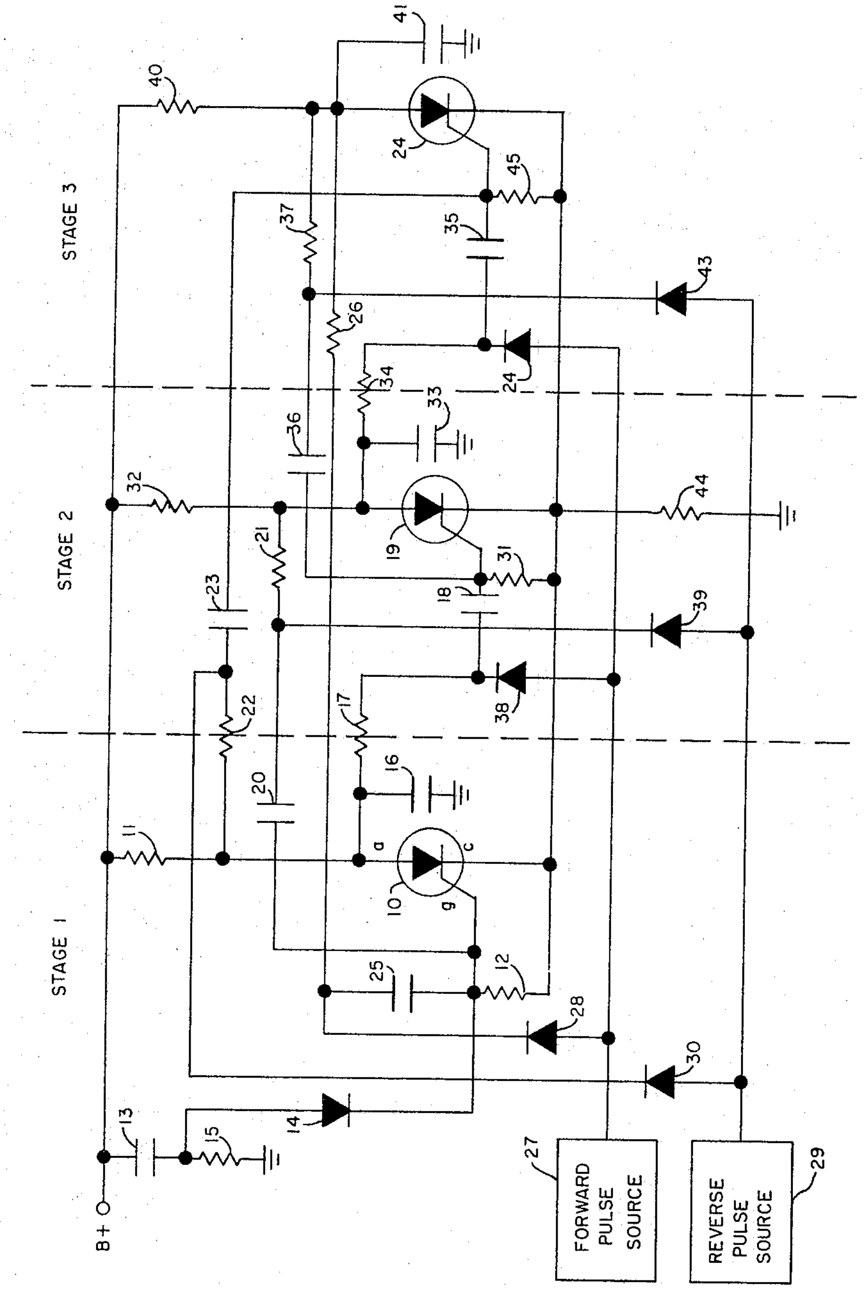
INVENTORS
JOHN N. LIBBY
HARRY D. MOORE
BY G + McCoy
Lenard Rawcy
ATTORNEYS United States Patent Office 3,317,751

Patented May 2, 1967

3,317,751

REVERSIBLE RING COUNTER EMPLOYING CASCADED SINGLE SCR STAGES

John N. Libby, Burtonsville, and Harry D. Moore, Adelphi, Md., assignors to the United States of America as represented by the Administrator of the National Aeronautics and Space Administration Filed May 4, 1964, Ser. No. 364,867
2 Claims. (Cl. 307—88.5)

The invention described herein may be manufactured by or for the Government of the United States of America for governmental purposes without the payment of any royalties thereon or therefor.

This invention relates generally to ring counters, and more particularly to a reversible ring counter.

Ring counters have, in recent years, become valuable circuits which have been incorporated into spacecrafts for selectively connecting the output signals from test apparatus contained in the spacecraft to the spacecraft's transponder for the transmission of information to telemetry stations located on the earth. Ring counters incorporating solid state components have been extensively used in these circuits. Advantages characteristic of the solid state ring counter reside in its simplicity of construction and in its use of non-specialized electronic components. It provides a simple rugged device for connecting a plurality of inputs selectively to one output or for selectively energizing a plurality of electronic circuits. These characteristics are exceedingly important in the operation of a satellite, resulting in the high reliability necessary to the operation of a vehicle in space. However, ring counters are not limited to use in a spacecraft, but are useful in other environments. For example, there are numerous applications in computer technology, telephone switching, data processing devices, or any electronic circuit where selective energization is required. The ring counter is useful wherever apparatus is desired for selectively connecting a plurality of electronic circuits in a sequential manner.

The ring counter comprises several serially connected cascaded stages, initially the first stage is energized which in turn energizes the load connected thereto, for example, a relay. On the application of an input control pulse to the counter, the first stage becomes de-energized and the next stage becomes energized and so on through a complete sequential cycling of the cascaded stages. Obviously, therefore, each load sequentially becomes energized on the application of an additional input pulse.

Previously developed ring counters using solid state components possess structural characteristics somewhat similar to the instant invention. These ring counters include as a basic element the ordinary switching transistor. The transistors are arranged in serially cascaded stages, each stage having one or more transistors. The interconnection between the stages is through various impedance elements in series and parallel arrangements. Upon the application of a pulse to this system, subsequent stages are energized in a sequential manner either by the automatic application of pulses or upon the application of pulses in a random manner. After one complete cycle, the cascaded stages of the counter revert to their original states and another complete cycle can be repeated.

There are, however, some disadvantages in previously developed ring counters, primarily in those using transistors as switching elements. Transistor ring counters usually require two transistors per stage in a flip-flop arrangement, with one transistor in each stage being energized at all times. Consequently, each stage is at all times using electrical energy. Furthermore, the use of two switching elements per stage results in a complicated electrical circuit.

It is an object of the present invention to provide a new and improved ring counter circuit.

Another object of the present invention is to provide an improved reversible ring counter circuit having a low power requirement.

A further object of the instant invention is to provide an improved reversible ring counter of a simplified circuit nature incorporating silicon controlled rectifiers as the principal energy switching element.

It is an additional object of the instant invention to provide an improved reversible ring counter of a simplified circuit nature incorporating silicon controlled rectifiers as the principal energy switching element with only one stage of the counter being energized at a time resulting in a low power requirement for operation.

The foregoing and other objects are realized in the instant invention by providing a series of cascaded ring circuits which can be sequentially operated in either the forward or in the reverse direction. Each individual ring stage consists of a silicon controlled rectifier (SCR), three condensers, two resistors and two steering diodes. The anode of the SCR is connected through a resistor to the potential source, the cathode is capacitor coupled to the gate of the prior stage and to the gate of the subsequent stage, and the gate of the SCR is capacitor coupled to the anode of the prior stage and to the anode of the subsequent stage. Consequently, due to the capacitor coupling, the ring counter can be operated in either the forward direction whereby each forward pulse applied thereto sequentially operates the subsequent stage of the counter, or the reverse direction whereby each reverse pulse applied thereto sequentially operates the prior stage of the counter.

Having only one stage operating at any particular moment results in a low power drain. The importance of this point of novelty can be readily appreciated when the counter is to be used with a source of power having a limited capability such as, for example, in a spacecraft.

To more readily appreciate the novelty of the instant invention, the operation of the SCR must be fully understood. The silicon controlled rectifier has been a recent development in the art of solid state components and has been widely accepted for circuit application. Briefly, the SCR is a three terminal or electrode PNPN switch having thyratron-like properties. The three terminals are designated as anode, cathode and gate. The SCR being a bistable device, having a "on" and an "off" state, can through the correct application of voltages to the terminals be placed in either state. Its operation, therefore, is like an electric switch, it is in fact an electronic switch. When a voltage is applied between the anode and cathode of an SCR, without a voltage being applied to its gate, the SCR is in its "off" state and presents a high impedance to the voltage source. However, when a voltage is applied to the gate the SCR is turned "on" and switches to its other state which presents a low impedance to the voltage source. One characteristic of this device is that when it is "on" the voltage at the gate can be removed without the device turning "off." Two ways of turning "off" an "on" SCR are by reverse biasing the anode to cathode voltage or by open circuiting the anode to cathode circuit. The instant invention contemplates using the former method, a reverse biasing voltage is applied to the cathode of the SCR which turns it "off" after it has previously been turned "on."

Other objects and attendant advantages of the present invention will be more readily apparent as the same becomes better understood by reference to the following detailed description when considered in conjunction with the accompanying drawing wherein:

The figure is a schematic diagram of the reversible ring counter of the instant invention having three cascaded stages.

Referring now to the drawing, an embodiment of the instant invention incorporating three cascade stages is shown in the figure. Stage one includes a silicon controlled rectifier (SCR) 10, the anode of which is connected through a resistor load 11 to B+ voltage source, the cathode of the SCR 10 is connected through a resistor 12 to its gate. The B+ source is also connected through a capacitor 13 in series with a diode 14 to the gate of SCR 10. The junction between the capacitor 13 and the diode 14 is connected through a resistor 15 to ground. The anode of the SCR 10 is connected through a capacitor 16 to ground and is further connected through a resistor 17 in series with a capacitor 18 to the gate of the SCR 19 of the second stage. The gate of the SCR 10 of the first stage is connected through a capacitor 20 in series with a resistor 21 to the anode of the SCR 19 of the second cascaded stage. The anode of the SCR 10 of the first stage is also connected through a resistor 22 in series with a capacitor 23 to the gate of SCR 24 of the third cascade stage. In addition, the gate of the SCR 10 of the first stage is connected through a capacitor 25 in series with a resistor 26 to the anode of the SCR of the third stage.

The input from the forward pulse source 27 is connected through a diode 28 to the junction of the capacitor 25, resistor 26 series combination which is connected between the gate of the SCR 10 of the first stage and the anode of the SCR 24 of the third stage. Finally, the input from the reverse pulse source 29 is connected through a diode 30 to the junction of the capacitor 23 and resistor 22 series combination which is connected between the anode of the SCR 10 of the first stage and the gate of the SCR 24 of the third stage.

Turning now to the second stage, the cathode of the SCR 19 of the second stage is connected through a resistor 31 to its gate; the anode of the SCR 19 of the second stage is connected through a load resistor 32 to the B+ voltage source. The anode of SCR 19 is further connected through a capacitor 33 to ground, and is also connected through a resistor 34 in series with a capacitor 35, to the gate of the SCR 24 of the third cascaded stage. The gate of the SCR 19 of the second stage is connected through a capacitor 36 in series with a resistor 37 to the anode of the SCR 24 of the third cascade stage. The input from the forward pulse source 27 is connected through a diode 38 to the junction of the capacitor 18, resistor 17 series combination which is connected between the anode of the SCR 10 of the first stage and the gate of the SCR 19 of the second stage. The input from the reverse pulse source is connected through a diode 39 to the junction of the capacitor 20, resistor 21 series combination which is connected between the gate of the SCR 10 of the first stage and the anode of the SCR 19 of the second stage.

The anode from the SCR 24 of the third or last stage of the ring counter is connected through a load resistor 40 to the B+ voltage source and is also connected through a capacitor 41 to ground. The input from the forward pulse source 27 is connected through a diode 42 to the junction of the resistor 34, capacitor 35 series combination which is connected between the anode of the SCR 19 of the second stage and the gate of the SCR 24 of the third stage. The gate of the SCR 24 of the third stage is also connected through a resistor 45 to its cathode. The input from the reverse pulse source 29 is connected through a diode 43 to the junction of the capacitor 36, resistor 37 series combination which is connected between the gate of the SCR 19 of the second stage and the anode of the SCR 24 of the third stage. Finally, the cathode of the SCR 10 of the first stage, the SCR 19 of the second stage, and the SCR 24 of the third stage are connected through a resistor 44 to ground.

Turning now to the operation of the reversible ring counter illustrated in the figure. It is readily apparent that all the capacitors of the circuit charge immediately upon the application of voltage to the circuit from the B+ source. The charging of the capacitor 13 connected between the gate of the SCR 10 of the first stage and the B+ voltage source creates a positive pulse which is applied through a diode 14 to the gate of the SCR 10 of the first stage. This positive pulse turns the first stage SCR 10 "on" and allows current to flow from the B+ source to the load resistor 11, through the SCR 10 of the first stage and through a resistor 44 to ground. Due to the SCR 10 af the first stage being turned "on" the voltage at its anode will be low as compared with the voltage at the anodes of the SCR 19 and 24 of the second and third stages.

When the forward pulse source 27 emits a pulse it biases "on" the diode 38 connected to the gate of the second stage which turns "on" the SCR 19 of the second stage. This allows a charged capacitor 33 connected between its anode and ground to discharge through the resistor 44 which reverse biases the SCR 10 of the first stage and turns it "off". By SCR 19 being "on" it biases the diode 42 connected to the gate of the third stage via capacitor 35 in such a manner that the next forward pulse from the forward pulse source 27 turns "on" the SCR 24 of the third stage. This allows the charged capacitor 41 to discharge through resistor 44. This discharge action of the capacitor 41 connected between the anode of the SCR 24 of the third stage and ground will turn "off" the SCR 19 of the second stage in the manner previously described.

A more detailed description of the biasing "on" of the diodes 28, 38 and 42 connected between the gates of the SCR's 10, 19 and 24 of the three stages and the forward pulse source 27 follows. Allow the condition to exist that the SCR 19 of the second stage is "on," the SCR's 10, 24 of the remaining stages are "off," and a pulse is emitted by the forward pulse source 27. Since the SCR 19 of the second stage is turned "on" the voltage at its anode is low. When a pulse from the forward pulse source 27 occurs, this low voltage allows current to pass from the pulse source 27 through the diode 42, connected to the gate of the SCR 24 of the third stage and through the SCR 19 of the second stage to ground. This current flow turns "on" the SCR 24 of the third stage. Turning now to a consideration of why the first stage is not also turned "on" when a pulse is emitted by forward pulse source 27: prior to the pulse the voltage at the anode of the SCR 24 of the third stage is high due to its being turned "off." Consequently, no current will pass from the pulse source 27 through the diode 28, connected to the gate of the SCR 10 of the first stage and therefore the SCR 10 of the first stage will not be turned "on."

Having the third or last stage coupled back through a resistor 26, capacitor 25 series combination to the first stage allows the circuit to operate in a cyclic manner. More specifically, the first stage is turned "on" when a pulse is applied to the gate of its SCR 10. When it is turned "on" the charged capacitor connected between its anode and ground discharges and reverse biases the last stage, turning it "off."

Turning now to the operation when a reverse pulse is applied to the circuit: This operation of the circuit, upon the occurrence of a reverse pulse, is identical to the forward direction with the exception that the bias of the diode connected to the gate of the SCR of the preceding stage occurs rather than biasing the succeeding stage gate diode. For example, allow the condition to exist that the SCR 19 of the second stage is turned "on" and the SCR's 10 and 24 of the remaining stages of the ring counter are turned "off." In this case, when a pulse is provided by the reverse pulse source 29, it passes through the diode 39 connected from the reverse pulse source to the gate of the SCR 10 of the first stage through the SCR 19 of the second stage to ground. In a manner similar to the situation when a forward pulse occurs the SCR 10 of the first stage is now turned "on" which discharges the voltage on the capacitor 16 connected from its anode to ground through a resistor 44 which turns the SCR 19 of the second stage "off."

It is evident that the instant invention provides a novel apparatus for a reversible ring counter which, though simple in construction, allows flexibility of operation in both forward and the reverse direction. Obviously the three stages disclosed are only by way of example and a considerably larger number of stages can be added which will all operate in a similar manner, depending upon the requirements of any specific situation. If additional stages are added it is only necessary to connect the last stage to the first stage in the manner that the third stage is connected to the first stage as described in the figure.

Obviously numerous modifications and variations are possible in the light of the above teachings. It is therefore understood that within the scope of the appended claims, the invention may be practiced otherwise than described herein.

We claim:

1. A reversible counter comprising:

a plurality of cascaded stages, each stage including as a switching device, a single silicon controlled rectifier having anode, cathode and gate electrodes, all of said cathodes being connected together to a source of reference potential through a common element having resistance;

the anode electrode of the silicon control rectifier of each stage being capacitor coupled to the gate electrode of the silicon control rectifier of the preceding and succeeding stages;

circuit means for applying a voltage to said cascaded stages, said voltage turning "on" the silicon control rectifier of the first stage of said cascaded stages;

each stage further including a capacitor connected in parallel with the silicon control rectifier between said circuit means and a reference potential;

control means for applying control pulses to said cascaded stages, the successive application of said control pulses selectively rendering the pulsed silicon control rectifier "on" and the preceding silicon control rectifier "off" in a sequential manner.

2. A reversible ring conuter comprising:

a plurality of silicon controlled rectifiers having anode, cathode and gate electrodes connected in cascade with the anode of each silicon controlled rectifier connected to the gate electrode of each successive silicon control rectifier, and each of the cathodes connected together to a source of reference potential through a common impedance element;

first means including a plurality of elements having resistance each of which respectively connects all of said anode electrodes to a common source of potential for initially rendering one silicon controlled rectifier conducting while the other silicon controlled rectifiers remain non-conducting;

a plurality of capacitors, a different one of said plurality of capacitors being connected in parallel with each silicon controlled rectifier between said respective elements having resistance and said reference potential; each of said capacitors associated with said non-conducting silicon controlled rectifier holding a charge;

second means for selectively applying a conduction initiation pulse to the gate electrode of either silicon controlled rectifier adjacent the initially conducting silicon controlled rectifier to permit discharge of the capacitor associated with the selected silicon controlled rectifier; and third means for applying the discharge of said associated capacitor to the cathode of the conducting silicon controlled rectifier to render it non-conducting.

References Cited by the Examiner

UNITED STATES PATENTS

| | | | |
|---|---|---|---|
| 2,533,739 | 12/1950 | Mumma | 328—43 |
| 2,931,922 | 4/1960 | Tubinis | 307—88.5 |
| 3,105,912 | 10/1963 | Johnston | 307—88.5 |
| 3,165,647 | 1/1965 | De Bottari et al. | 307—88.5 |
| 3,217,185 | 11/1965 | Jansons | 307—88.5 |

OTHER REFERENCES

"PNPN Devices," by McDermott in Space/Aeronautics, November 1961, pp. 125–137.

ARTHUR GAUSS, *Primary Examiner.*

J. HEYMAN, *Assistant Examiner.*